United States Patent
Yun et al.

(10) Patent No.: US 9,460,980 B2
(45) Date of Patent: Oct. 4, 2016

(54) SYSTEMS, APPARATUS, AND METHODS FOR HEAT DISSIPATION

(71) Applicant: QUALCOMM Incorporated, San Diego, CA (US)

(72) Inventors: Sun Yun, San Diego, CA (US); Rajneesh Kumar, San Diego, CA (US); Houssam Wafic Jomaa, San Diego, CA (US); Joan Rey V. Buot, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 14/625,452

(22) Filed: Feb. 18, 2015

(65) Prior Publication Data
US 2016/0240455 A1 Aug. 18, 2016

(51) Int. Cl.
| | |
|---|---|
| H01L 21/60 | (2006.01) |
| H01L 23/367 | (2006.01) |
| H01L 23/373 | (2006.01) |
| H01L 23/528 | (2006.01) |
| H01L 25/07 | (2006.01) |

(52) U.S. Cl.
CPC ....... *H01L 23/3675* (2013.01); *H01L 23/3736* (2013.01); *H01L 23/528* (2013.01); *H01L 25/072* (2013.01)

(58) Field of Classification Search
USPC ........................................................ 257/706
See application file for complete search history.

(56) References Cited

U.S. PATENT DOCUMENTS

| | | | |
|---|---|---|---|
| 6,038,137 A | 3/2000 | Bhatt et al. | |
| 6,175,497 B1 | 1/2001 | Tseng et al. | |
| 6,650,015 B2 | 11/2003 | Chen et al. | |
| 7,061,102 B2 | 6/2006 | Eghan et al. | |
| 7,786,591 B2 | 8/2010 | Khan et al. | |
| 2004/0175862 A1 | 9/2004 | Tao et al. | |
| 2006/0109630 A1* | 5/2006 | Colgan .................. | H01L 23/42 361/718 |
| 2007/0126113 A1 | 6/2007 | Ohkubo et al. | |
| 2009/0001528 A1 | 1/2009 | Braunisch et al. | |
| 2009/0218680 A1 | 9/2009 | Celik et al. | |
| 2009/0283889 A1 | 11/2009 | Jang et al. | |
| 2010/0213600 A1* | 8/2010 | Lau ....................... | H01L 23/055 257/693 |
| 2013/0056862 A1 | 3/2013 | Kim et al. | |

OTHER PUBLICATIONS

International Search Report and Written Opinion—PCT/US2016/016002 ISA/EPO—May 6, 2016.

* cited by examiner

*Primary Examiner* — Thao P Le
(74) *Attorney, Agent, or Firm* — Muncy, Geissler, Olds & Lowe, P.C.

(57) ABSTRACT

Some examples of the disclosure include a semiconductor package having a heat spreader, an outer perimeter portion attached to the bottom of the heat spreader along the perimeter and having a plurality of electrical pathways, a package substrate located below and spaced from the outer perimeter portion and having a plurality of electrical pathways, a plurality of connection points located between the outer perimeter component and the package substrate to provide connection points coupling the plurality of electrical pathways of the outer perimeter portion to the plurality of electrical pathways in the package substrate, and a cavity formed on the bottom of the heat spreader inside the outer perimeter portion.

30 Claims, 9 Drawing Sheets

SYSTEMS, APPARATUS, AND METHODS FOR HEAT DISSIPATION

FIELD OF DISCLOSURE

This disclosure relates generally to heat dissipation coupled with electrical connectivity, and more specifically, but not exclusively, to a semiconductor package.

BACKGROUND

As the need for more complex semiconductor packages with increased functionality grows, there is a significant challenge associated with achieving this goal. The challenge is how to increase the routing density necessitated by the increased functionality without impacting other parameters or unduly increasing the package area. The conventional approach to this challenge is to reduce the metal line and space parameters (L/S) and add more routing layers to the package substrate. However, this increases the package area, which results in an increase in potential package warpage. Accordingly, there is a need for systems, apparatus, and methods that improve upon conventional approaches without increasing package area or routing density.

The inventive features that are characteristic of the teachings, together with further features and advantages, are better understood from the detailed description and the accompanying figures. Each of the figures is provided for the purpose of illustration and description only, and does not limit the present teachings.

SUMMARY

The following presents a simplified summary relating to one or more aspects and/or examples associated with the apparatus and methods disclosed herein. As such, the following summary should not be considered an extensive overview relating to all contemplated aspects and/or examples, nor should the following summary be regarded to identify key or critical elements relating to all contemplated aspects and/or examples or to delineate the scope associated with any particular aspect and/or example. Accordingly, the following summary has the sole purpose to present certain concepts relating to one or more aspects and/or examples relating to the apparatus and methods disclosed herein in a simplified form to precede the detailed description presented below.

In some examples of the disclosure, the system, apparatus, and method includes a semiconductor package comprising: a heat spreader having a bottom side and a perimeter; an outer perimeter portion attached to the bottom side of the heat spreader along the perimeter of the heat spreader, the outer perimeter portion having a plurality of electrical pathways therein; a package substrate located below and spaced from the outer perimeter portion, the package substrate having a plurality of electrical pathways therein; a plurality of connection points located between the outer perimeter component and the package substrate, the plurality of connection points coupling the plurality of electrical pathways of the outer perimeter portion to the plurality of electrical pathways in the package substrate; and wherein the outer perimeter portion forms a cavity on the bottom side of the heat spreader.

In some examples of the disclosure, the system, apparatus, and method includes a semiconductor package comprising: a heat spreader having a bottom side and a perimeter; an outer perimeter portion attached to the bottom side of the heat spreader along the perimeter of the heat spreader, the outer perimeter portion having a plurality of electrical pathways therein; an inner portion attached to the bottom side of the heat spreader, the inner portion having a plurality of electrical pathways therein; a package substrate located below and spaced from the outer perimeter portion, the package substrate having a plurality of electrical pathways therein; a plurality of connection points located between the outer perimeter component and the package substrate, the plurality of connection points coupling the plurality of electrical pathways of the outer perimeter portion to the plurality of electrical pathways in the package substrate; and wherein the outer perimeter portion and the inner portion form a first cavity on the bottom side of the heat spreader and a second cavity on the bottom side of the heat spreader horizontally adjacent the first cavity and spaced therefrom.

In some examples of the disclosure, the system, apparatus, and method includes a heat spreader comprising: a first portion having a bottom side and a perimeter; an outer perimeter portion attached to the bottom side of the first portion along the perimeter of the first portion, the outer perimeter portion having a plurality of electrical pathways therein; a plurality of connection points located on a bottom side of the outer perimeter opposite the first portion, the plurality of connection points being coupled to the plurality of electrical pathways of the outer perimeter portion and providing an external connection; and wherein the outer perimeter portion forms a cavity on the bottom side of the first portion.

In some examples of the disclosure, the system, apparatus, and method includes a heat spreader comprising: a first portion having a bottom side and a perimeter; an outer perimeter portion attached to the bottom side of the first portion along the perimeter of the first portion, the outer perimeter portion having a plurality of electrical pathways therein; an inner portion attached to the bottom side of the first portion, the inner portion having a plurality of electrical pathways therein; a plurality of connection points located between the outer perimeter component and the package substrate, the plurality of connection points coupling the plurality of electrical pathways of the outer perimeter portion to the plurality of electrical pathways in the package substrate; and wherein the outer perimeter portion and the inner portion form a first cavity on the bottom side of the first portion and a second cavity on the bottom side of the first portion horizontally adjacent the first cavity and spaced therefrom.

Other features and advantages associated with the apparatus and methods disclosed herein will be apparent to those skilled in the art based on the accompanying drawings and detailed description.

BRIEF DESCRIPTION OF THE DRAWINGS

A more complete appreciation of aspects of the disclosure and many of the attendant advantages thereof will be readily obtained as the same becomes better understood by reference to the following detailed description when considered in connection with the accompanying drawings which are presented solely for illustration and not limitation of the disclosure, and in which.

In accordance with common practice, the features depicted by the drawings may not be drawn to scale. Accordingly, the dimensions of the depicted features may be arbitrarily expanded or reduced for clarity. In accordance with common practice, some of the drawings are simplified for clarity. Thus, the drawings may not depict all components of a particular apparatus or method. Further, like reference numerals denote like features throughout the specification and figures.

DETAILED DESCRIPTION

The exemplary methods, apparatus, and systems disclosed herein advantageously address the industry needs, as well as other previously unidentified needs, and mitigate shortcomings of the conventional methods, apparatus, and systems. For instance, a semiconductor package in accordance with some examples may include a heat spreader for dissipating heat produced by the semiconductor package and providing mechanical support to prevent warpage of the semiconductor package; an outer perimeter portion attached to the heat spreader along the perimeter and having a plurality of electrical pathways therein to alleviate routing density of the semiconductor package; a package substrate located below and spaced from the outer perimeter portion and having a plurality of electrical pathways therein; a plurality of connection points located between the outer perimeter component and the package substrate that couple the plurality of electrical pathways of the outer perimeter portion to the plurality of electrical pathways in the package substrate; and wherein the outer perimeter portion forms a cavity on the bottom side of the heat spreader for the attachment of a semiconductor die. In some examples, the semiconductor package has two cavities for the attachment of two semiconductor dies and an inner portion located between the two cavities and having a plurality of electrical pathways therein for coupling the two semiconductor dies.

Various aspects are disclosed in the following description and related drawings to show specific examples relating to the disclosure. Alternate examples will be apparent to those skilled in the pertinent art upon reading this disclosure, and may be constructed and practiced without departing from the scope or spirit of the disclosure. Additionally, well-known elements will not be described in detail or may be omitted so as to not obscure the relevant details of the aspects and examples disclosed herein.

The word "exemplary" is used herein to mean "serving as an example, instance, or illustration." Any details described herein as "exemplary" is not necessarily to be construed as preferred or advantageous over other examples. Likewise, the term "examples" does not require that all examples include the discussed feature, advantage or mode of operation. Use of the terms "in one example," "an example," "in one feature," and/or "a feature" in this specification does not necessarily refer to the same feature and/or example. Furthermore, a particular feature and/or structure can be combined with one or more other features and/or structures. Moreover, at least a portion of the apparatus described hereby can be configured to perform at least a portion of a method described hereby.

The terminology used herein is for the purpose of describing particular examples only and is not intended to be limiting of examples of the disclosure. As used herein, the singular forms "a," "an," and "the" are intended to include the plural forms as well, unless the context clearly indicates otherwise. It will be further understood that the terms "comprises", "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It should be noted that the terms "connected," "coupled," or any variant thereof, mean any connection or coupling, either direct or indirect, between elements, and can encompass a presence of an intermediate element between two elements that are "connected" or "coupled" together via the intermediate element. Coupling and/or connection between the elements can be physical, logical, or a combination thereof. As employed herein, elements can be "connected" or "coupled" together, for example, by using one or more wires, cables, and/or printed electrical connections, as well as by using electromagnetic energy. The electromagnetic energy can have wavelengths in the radio frequency region, the microwave region and/or the optical (both visible and invisible) region. These are several non-limiting and non-exhaustive examples.

It should be understood that the term "signal" can include any signal such as a data signal, audio signal, video signal, multimedia signal, analog signal, and/or digital signal. Information and signals can be represented using any of a variety of different technologies and techniques. For example, data, an instruction, a process step, a command, information, a signal, a bit, and/or a symbol described in this description can be represented by a voltage, a current, an electromagnetic wave, a magnetic field and/or particle, an optical field and/or particle, and any combination thereof.

Any reference herein to an element using a designation such as "first," "second," and so forth does not limit the quantity and/or order of those elements. Rather, these designations are used as a convenient method of distinguishing between two or more elements and/or instances of an element. Thus, a reference to first and second elements does not mean that only two elements can be employed, or that the first element must necessarily precede the second element. Also, unless stated otherwise, a set of elements can comprise one or more elements. In addition, terminology of the form "at least one of: A, B, or C" used in the description or the claims can be interpreted as "A or B or C or any combination of these elements."

Further, many examples are described in terms of sequences of actions to be performed by, for example, elements of a computing device. It will be recognized that various actions described herein can be performed by specific circuits (e.g., application specific integrated circuits (ASICs)), by program instructions being executed by one or more processors, or by a combination of both. Additionally, these sequence of actions described herein can be considered to be embodied entirely within any form of computer readable storage medium having stored therein a corresponding set of computer instructions that upon execution would cause an associated processor to perform the functionality described herein. Thus, the various aspects of the disclosure may be embodied in a number of different forms, all of which have been contemplated to be within the scope of the claimed subject matter. In addition, for each of the examples described herein, the corresponding form of any such examples may be described herein as, for example, "logic configured to" perform the described action.

In this description, certain terminology is used to describe certain features. The term "mobile device" can describe, and is not limited to, a mobile phone, a mobile communication device, a pager, a personal digital assistant, a personal information manager, a mobile hand-held computer, a laptop computer, a wireless device, a wireless modem, and/or other types of portable electronic devices typically carried by a person and/or having communication capabilities (e.g., wireless, cellular, infrared, short-range radio, etc.). Further, the terms "user equipment" (UE), "mobile terminal," "mobile device," and "wireless device," can be interchangeable.

Figure 1:
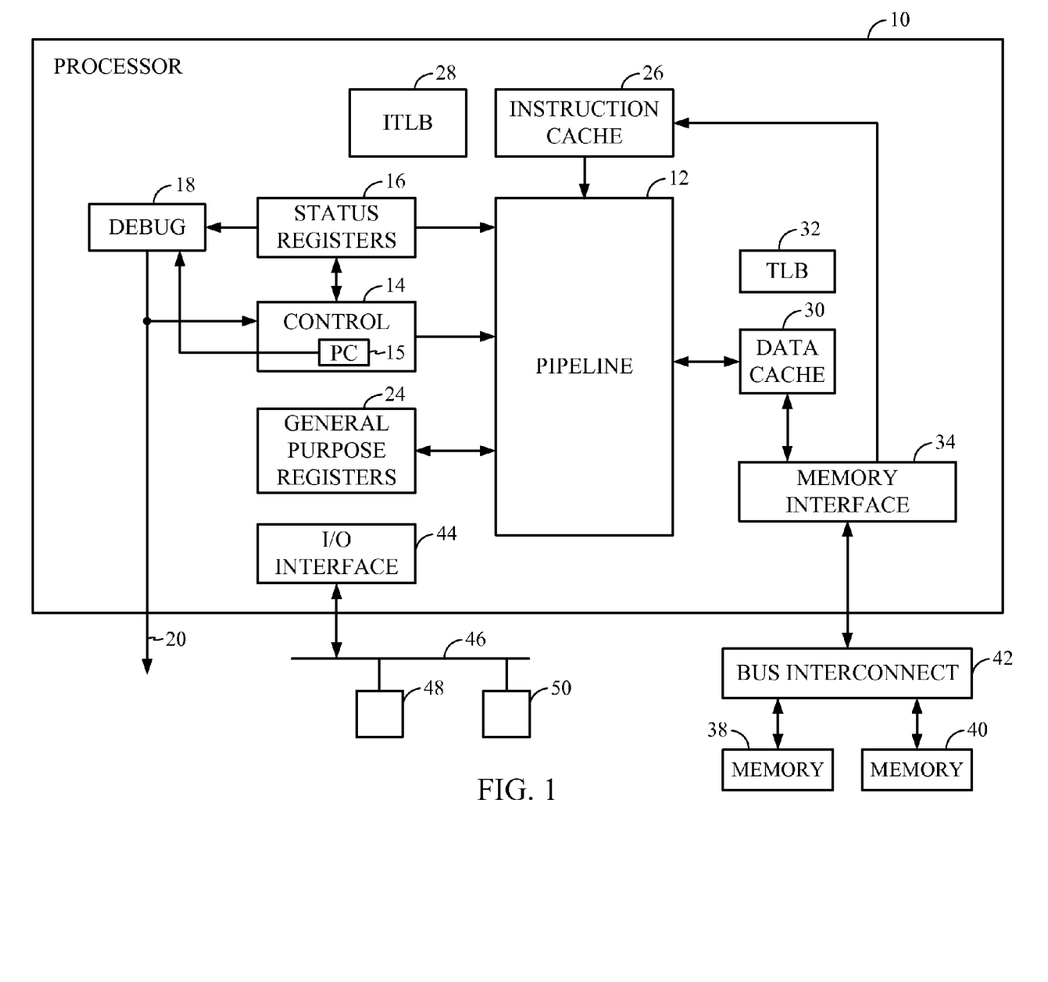
FIG. 1 illustrates an exemplary processor in accordance with some examples of the disclosure.

FIG. 1 depicts a functional block diagram of an exemplary processor 10, such as an ASIC 208 (see below) configured to incorporate features of the improved data decompression. Processor 10 executes instructions in an instruction execution pipeline 12 according to control logic 14. Control logic 14 maintains a Program Counter (PC) 15, and sets and clears bits in one or more status registers 16 to indicate, e.g., the current instruction set operating mode, information regarding the results of arithmetic operations and logical comparisons (zero, carry, equal, not equal), and the like. In some examples, pipeline 12 may be a superscalar design, with multiple, parallel pipelines. Pipeline 12 may also be referred to as an execution unit. A General Purpose Register (GPR) file 20 provides a list of general purpose registers 24 accessible by pipeline 12, and comprising the top of the memory hierarchy.

Processor 10, which executes instructions from at least two instruction sets in different instruction set operating modes, additionally includes a debug circuit 18, operative to compare, upon the execution of each instruction, at least a predetermined target instruction set operating mode to the current instruction set operating mode, and to provide an indication of a match between the two. Debug circuit 18 is described in greater detail below.

Pipeline 12 fetches instructions from an instruction cache (I-cache) 26, with memory address translation and permissions managed by an Instruction-side Translation Lookaside Buffer (ITLB) 28. Data is accessed from a data cache (D-cache) 30, with memory address translation and permissions managed by a main Translation Lookaside Buffer (TLB) 32. In various examples, ITLB 28 may comprise a copy of part of TLB 32. Alternatively, ITLB 28 and TLB 32 may be integrated. Similarly, in various examples of processor 10, I-cache 26 and D-cache 30 may be integrated, or unified. Further, I-cache 26 and D-cache 30 may be L1 caches. Misses in I-cache 26 and/or D-cache 30 cause an access to main (off-chip) memory 38, 40 by a memory interface 34. Memory interface 34 may be a master input to a bus interconnect 42 implementing a shared bus to one or more memory devices 38, 40 that may incorporate the improved data decompression in accordance with some examples of the disclosure. Additional master devices (not shown) may additionally connect to bus interconnect 42.

Processor 10 may include input/output (I/O) interface 44, which may be a master device on a peripheral bus, across which I/O interface 44 may access various peripheral devices 48, 50 via bus 46. Those of skill in the art will recognize that numerous variations of processor 10 are possible. For example, processor 10 may include a second-level (L2) cache for either or both I and D caches 26, 30. In addition, one or more of the functional blocks depicted in processor 10 may be omitted from a particular example. Other functional blocks that may reside in processor 10, such as a JTAG controller, instruction pre-decoder, branch target address cache, and the like are not germane to a description of the present disclosure, and are omitted for clarity.

Figure 2:
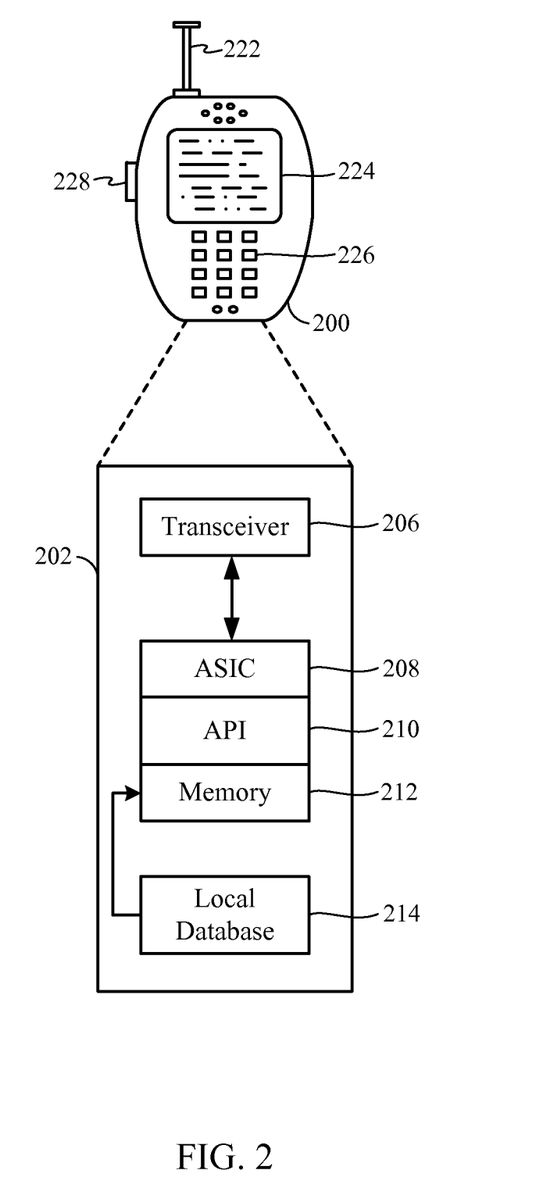
FIG. 2 illustrates exemplary user equipment (UE) in accordance with some examples of the disclosure.

Referring to FIG. 2, a system 100 that includes a UE 200, (here a wireless device), such as a cellular telephone, which has a platform 202 that can receive and execute software applications, data and/or commands transmitted from a radio access network (RAN) that may ultimately come from a core network, the Internet and/or other remote servers and networks. Platform 202 can include transceiver 206 operably coupled to an application specific integrated circuit ("ASIC" 208), or other processor, microprocessor, logic circuit, or other data processing device. ASIC 208 or other processor executes the application programming interface ("API") 210 layer that interfaces with any resident programs in memory 212 of the wireless device. Memory 212 can be comprised of read-only or random-access memory (RAM and ROM), EEPROM, flash cards, or any memory common to computer platforms. Platform 202 also can include local database 214 that can hold applications not actively used in memory 212. Local database 214 is typically a flash memory cell, but can be any secondary storage device as known in the art, such as magnetic media, EEPROM, optical media, tape, soft or hard disk, or the like. Internal platform 202 components can also be operably coupled to external devices such as antenna 222, display 224, push-to-talk button 228 and keypad 226 among other components, as is known in the art.

Accordingly, an example of the disclosure can include a UE including the ability to perform the functions described herein. As will be appreciated by those skilled in the art, the various logic elements can be embodied in discrete elements, software modules executed on a processor or any combination of software and hardware to achieve the functionality disclosed herein. For example, ASIC 208, memory 212, API 210 and local database 214 may all be used cooperatively to load, store and execute the various functions disclosed herein and thus the logic to perform these functions may be distributed over various elements. Alternatively, the functionality could be incorporated into one discrete component. Therefore, the features of UE 200 in FIG. 2 are to be considered merely illustrative and the disclosure is not limited to the illustrated features or arrangement.

The wireless communication between UE 200 and the RAN can be based on different technologies, such as code division multiple access (CDMA), W-CDMA, time division multiple access (TDMA), frequency division multiple access (FDMA), Orthogonal Frequency Division Multiplexing (OFDM), Global System for Mobile Communications (GSM), 3GPP Long Term Evolution (LTE) or other protocols that may be used in a wireless communications network or a data communications network.

Figure 3:
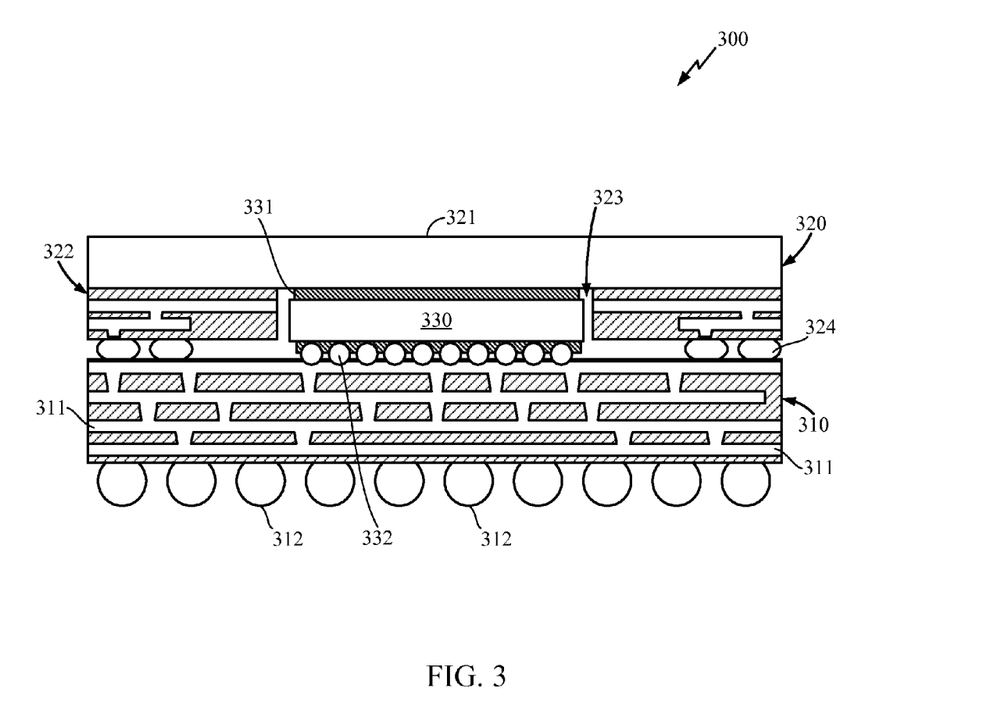
FIG. 3 illustrates an exemplary semiconductor package with a die in accordance with some examples of the disclosure.

FIG. 3 illustrates an exemplary semiconductor package with a die in accordance with some examples of the disclosure. As shown in FIG. 3, a semiconductor package 300 may include a bottom package substrate 310, a top package component 320 located above the bottom package substrate 310, and a semiconductor die 330 located on a surface of the bottom package substrate 310 and between the bottom package substrate 310 and the top package component 320. The bottom package substrate 310 may include one or more routing distribution layers (RDLs) 311 for routing signals to and from the bottom package substrate 310 and a plurality of solder ball 312 for external connections. The RDLs 311 may be embedded in the bottom package substrate 310, on a top or bottom surface of the bottom package substrate 310, or a combination of embedded and surface mounted locations.

The top package component 320 may include a heat dissipation or spreader component 321 for dissipating and storing heat generated by the semiconductor die 330, an outer perimeter component 322 extending downward towards the bottom package substrate 310 from a bottom surface of the heat spreader component 321 along the outer perimeter of the heat spreader component 321, a cavity 323 located approximately in the center of the heat spreader component 321 facing downward from the bottom surface of the heat spreader component 321, and a plurality of solder connection points 324 located between the outer perimeter component 322 and the bottom package substrate 310 to provide a signal path between these components. The solder connection points 324, outer perimeter component 322, and heat spreader component 321 combine to increase the structural integrity of the semiconductor package 300 and decrease the risk of package warpage.

The semiconductor die 330 may be located in the cavity 323 with a back side facing the heat spreader component 321 and an active side facing the bottom package substrate 310. The semiconductor die 330 may include a thermal interface material 331 between the semiconductor die 330 and the heat spreader component 321 to thermally couple the semiconductor die 330 to the heat spreader component 321 and a plurality of solder connection points 332 between the semiconductor die 330 and the bottom package substrate 310 to provide an electrical pathway between the semiconductor die 330 and the bottom package substrate 310.

Figure 4A:
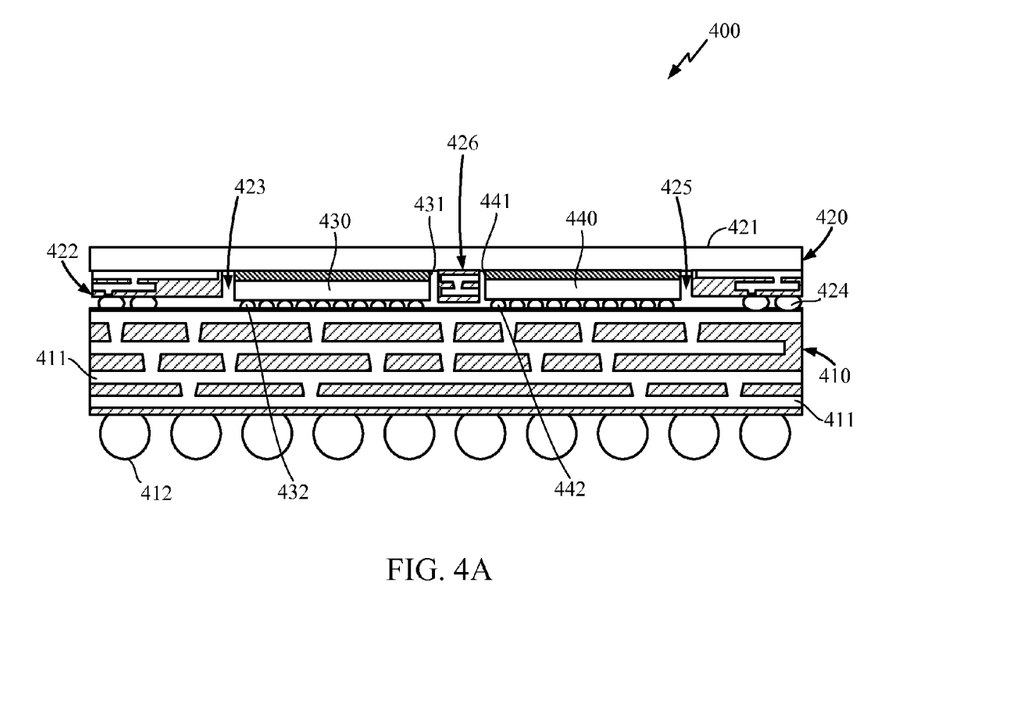
FIGS. 4A-E illustrate an exemplary semiconductor package with two dies in accordance with some examples of the disclosure.

FIGS. 4A-E illustrate an exemplary semiconductor package with two dies in accordance with some examples of the disclosure. As shown in FIG. 4A, a semiconductor package 400 may include a bottom package substrate 410, a top package component 420 located above the bottom package substrate 410, a first semiconductor die 430 located on a surface of the bottom package substrate 410 and between the bottom package substrate 410 and the top package component 420, and a second semiconductor die 440 located on the surface of the bottom package substrate 410 and between the bottom package substrate 410 and the top package component 420 and space horizontally from the first semiconductor die 430. The bottom package substrate 410 may include one or more routing distribution layers (RDLs) 411 for routing signals to and from the bottom package substrate 410 and a plurality of solder ball 412 for external connections. The RDLs 411 may be embedded in the bottom package substrate 410, on a top or bottom surface of the bottom package substrate 410, or a combination of embedded and surface mounted locations.

The top package component 420 may include a heat dissipation or spreader component 421 for dissipating and storing heat generated by the semiconductor dies 430 and 440, a first cavity 423 facing downward from a bottom surface of the heat spreader component 421, a second cavity 425 facing downward from the bottom surface of the heat spreader component 421 and horizontally adjacent and spaced from the first cavity 423, an outer perimeter component 422 extending downward towards the bottom package substrate 410 from the bottom surface of the heat spreader component 421 along the outer perimeter of the heat spreader component 421, an inner component 426 extending downward towards the bottom package substrate 410 from the bottom surface of the heat spreader component 421 and located between the first cavity 423 and the second cavity 425, and a first plurality of solder connection points 424 located between the outer perimeter component 422 and the bottom package substrate 410 to provide a signal path between these components. The solder connection points 424, outer perimeter component 422, inner component 426, and heat spreader component 421 combine to increase the structural integrity of the semiconductor package 400 and decrease the risk of package warpage.

The first semiconductor die 430 may be located in the first cavity 423 with a back side facing the heat spreader component 421 and an active side facing the bottom package substrate 410. The first semiconductor die 430 may include a thermal interface material 431 between the semiconductor die 430 and the heat spreader component 421 to thermally couple the semiconductor die 430 to the heat spreader component 421 and a plurality of solder connection points 432 between the semiconductor die 430 and the bottom package substrate 410 to provide an electrical pathway between the semiconductor die 430 and the bottom package substrate 410.

The second semiconductor die 440 may be located in the second cavity 425 with a back side facing the heat spreader component 421 and an active side facing the bottom package substrate 410. The semiconductor die 440 may include a thermal interface material 441 between the semiconductor die 440 and the heat spreader component 421 to thermally couple the semiconductor die 440 to the heat spreader component 421 and a plurality of solder connection points 442 between the semiconductor die 440 and the bottom package substrate 410 to provide an electrical pathway between the semiconductor die 440 and the bottom package substrate 410.

Figure 4B:
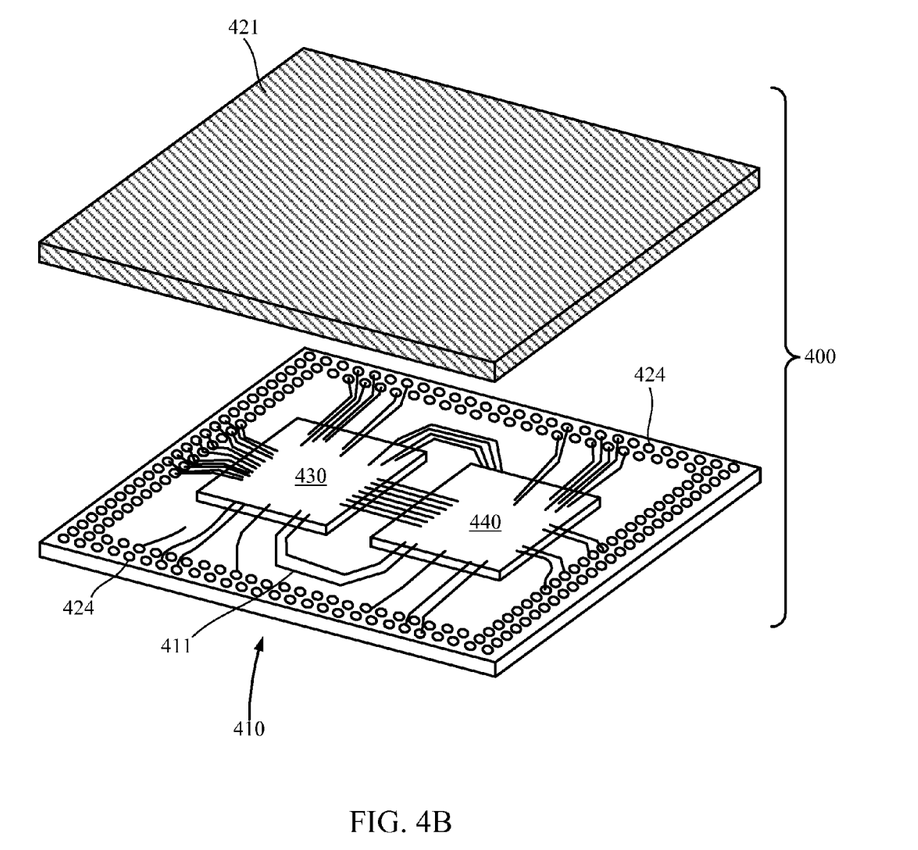

FIG. 4B shows an exploded view of the semiconductor package 400 with the heat spreader component 421 above the bottom package substrate 410, the first semiconductor die 430 and second semiconductor die 440 on the bottom package substrate 410, the plurality of solder connection points 424, and a top layer of RDLs 411 on the top surface of the bottom package substrate 410. As shown in this example, the top layer RDLs 411 provide signal paths between the solder connection points 424, the first semiconductor die 430, the second semiconductor die 440, and the bottom package substrate 410.

Figure 4C:
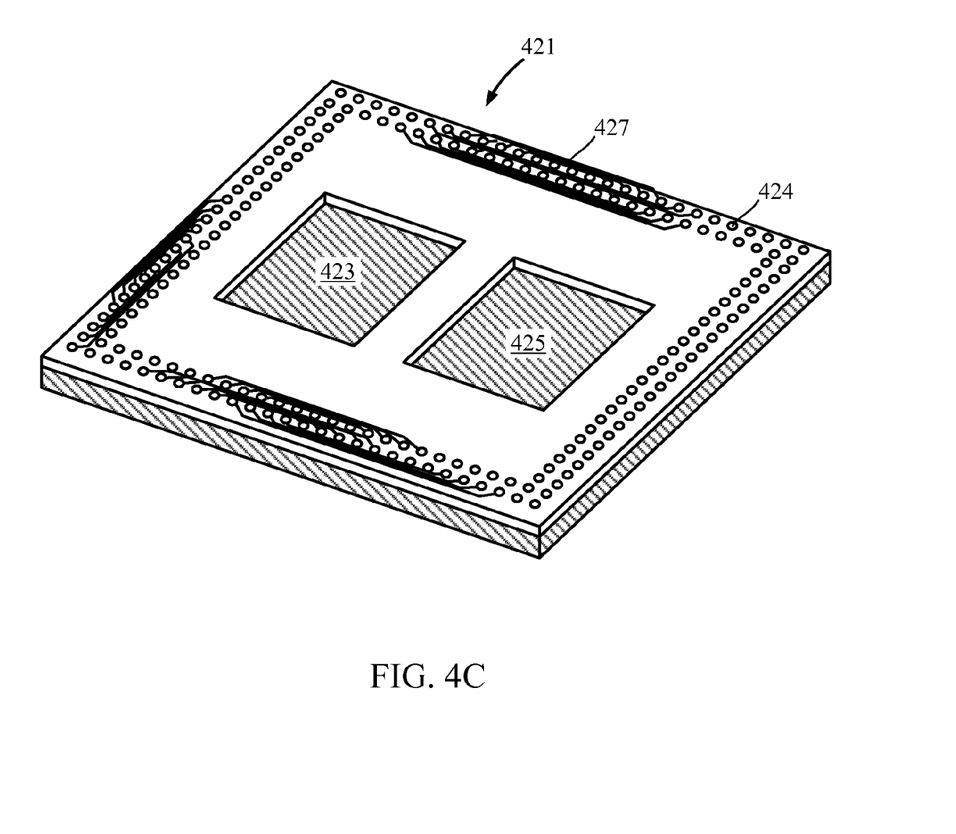

FIG. 4C shows an upside down view of the heat spreader component 421 with the first cavity 423, second cavity 425, the plurality of solder connection points 424 along the perimeter of the heat spreader component 421, and electrical pathways 427 that provide signal paths between the plurality of solder connection points 424.

Figure 4D:
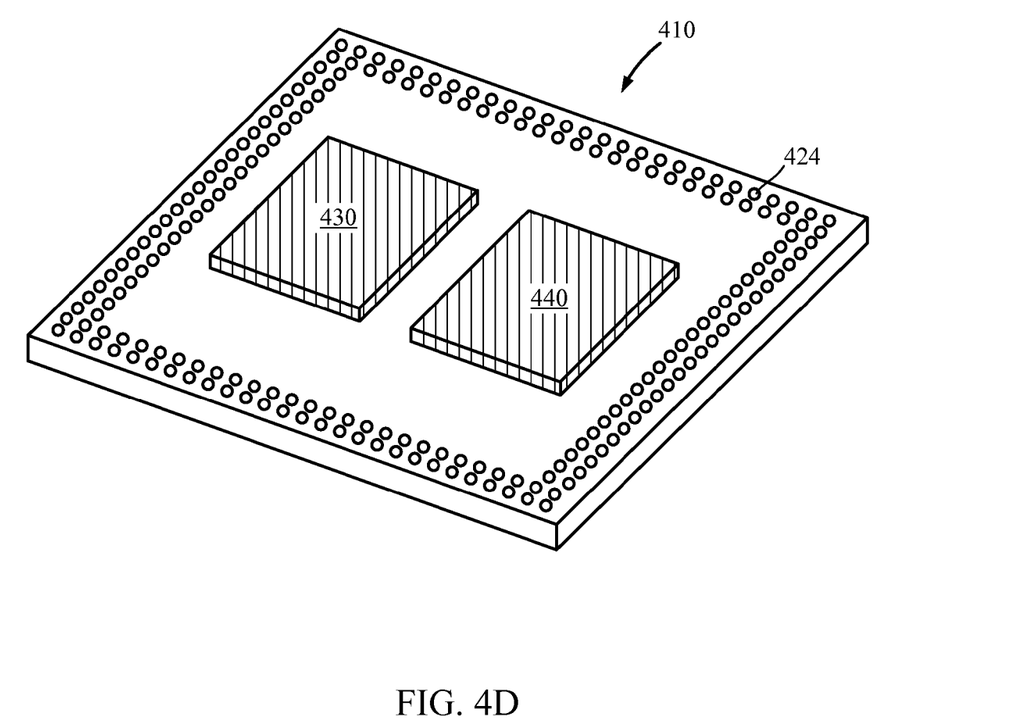

FIG. 4D shows the bottom package substrate 410, the plurality of solder connection points 424 along the perimeter of the bottom package substrate 410, the first semiconductor die 430, and the second semiconductor die 440 horizontally adjacent and spaced from the first semiconductor die 430.

Figure 4E:
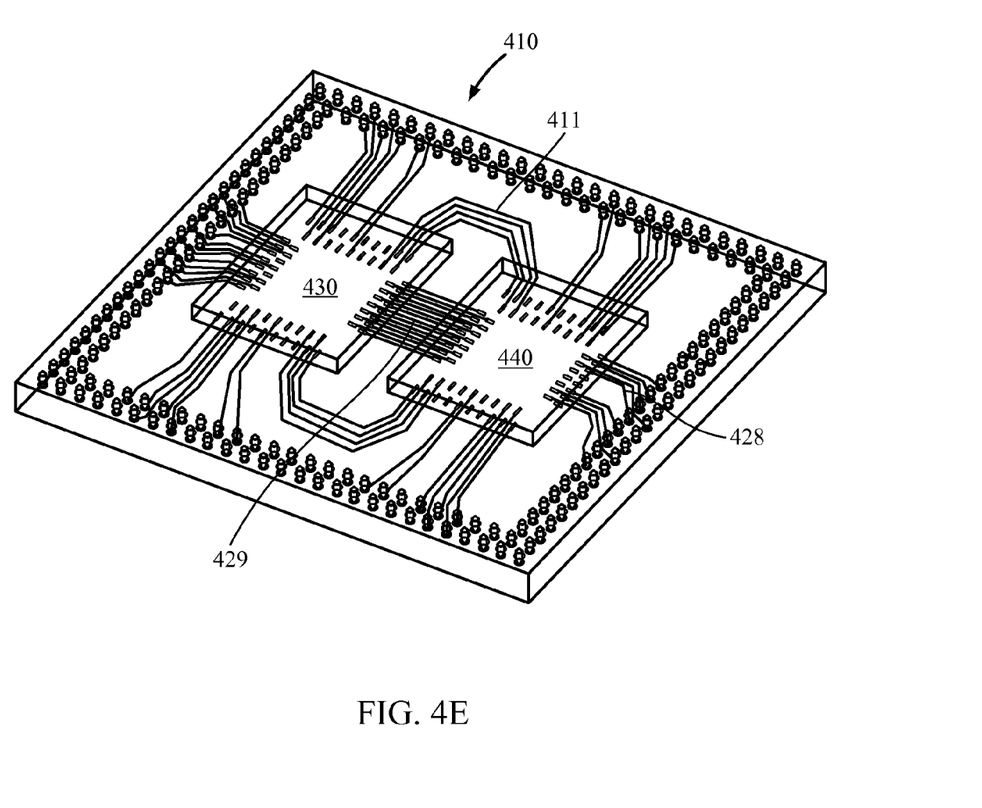

FIG. 4E shows a partial schematic view of the some of the top layer of electrical pathways 411 of the bottom package substrate 410, a plurality of electrical pathways 428 located in outer perimeter component 422, and a plurality of electrical pathways 429 located in the inner component 426. The top layer of electrical pathways 411 may provide signal paths between the first semiconductor die 430 and the second semiconductor die 440, and between each of the first and second semiconductor dies 430 and 440 and the bottom package substrate 410 through the solder connection points 424. The plurality of electrical pathways 428 may provide signal paths between each of the first and second semiconductor dies 430 and 440 and the bottom package substrate 410 through the solder connection points 424. The plurality of electrical pathways 429 may provide signal paths between the first semiconductor die 430 and the second semiconductor die 440.

Figure 5A:
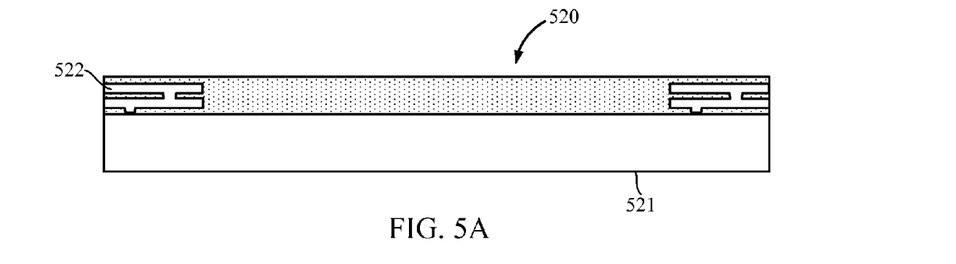
FIGS. 5A-D illustrate an exemplary partial process flow for the formation of a semiconductor package with a die in accordance with some examples of the disclosure.

FIGS. 5A-D illustrate an exemplary partial process flow for the formation of a semiconductor package with a die in accordance with some examples of the disclosure. The partial process flow begins as shown in FIG. 5A with building a top package component 520 by layering dielectric and metal layers of an outer perimeter component 522 on a bottom of a heat spreader component 521. This may be done with combination of lamination of dielectric material and plating cu on top of the dielectric layer.

Figure 5B:
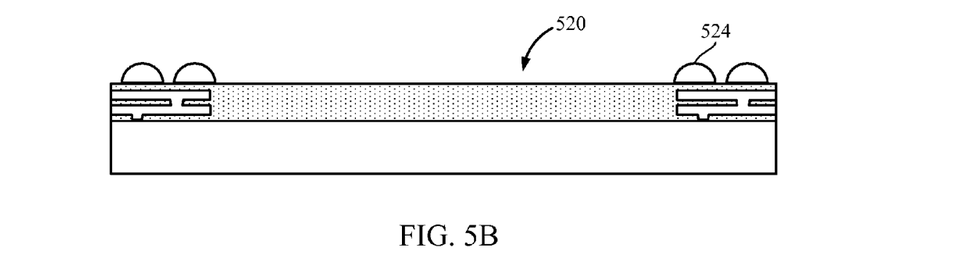

The process continues as shown in FIG. 5B with the formation of solder connection points 524 on a bottom surface of the outer perimeter components 522. This may be accomplished in a number of ways, such as printing solder paste on the bottom surface of the outer perimeter components 522 and reflowing the solder to form solder interconnects using a solder mask and opening formed therein for the solder paste print.

Figure 5C:
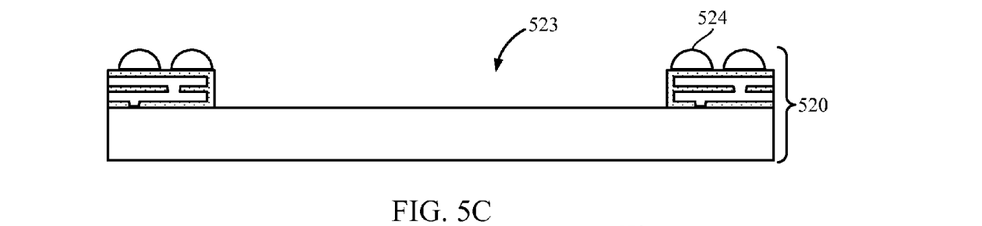

The process continues as shown in FIG. 5C with the formation of a cavity 523 in the top package component 520 towards the center of the top package component 520 inside the outer perimeter component 522 on the bottom surface of the heat spreader component 521. This may be accomplished in a number of ways, such as laser or mechanical drilling through dielectric layer to expose the bottom surface of the heat spreader component 521 wherein a thermal interface material 531 (not shown) may be applied.

Figure 5D:
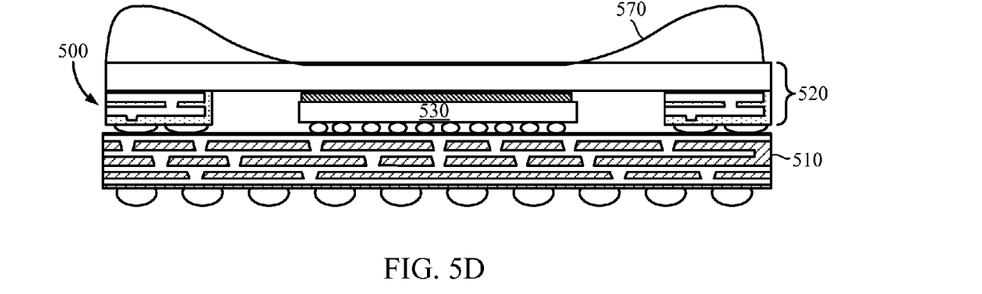

The process continues as shown in FIG. 5D with the application of the thermal interface material 531 in the cavity 523 followed by attachment of the top package component 520 to a bottom package substrate 510 with a semiconductor die 530 on a top surface of the bottom package substrate 510 such that the semiconductor die 530 is centered in cavity 523. The solder connection points 524 may be subject to a reflow process while a spring clip 570 is used to secure the heat spreader component 520 to the bottom package substrate 510.

Nothing stated or illustrated depicted in this application is intended to dedicate any component, step, feature, benefit, advantage, or equivalent to the public, regardless of whether the component, step, feature, benefit, advantage, or the equivalent is recited in the claims.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the examples disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The methods, sequences and/or algorithms described in connection with the examples disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor.

The various illustrative logical blocks, modules, and circuits described in connection with the aspects disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

Although some aspects have been described in connection with a device, it goes without saying that these aspects also constitute a description of the corresponding method, and so a block or a component of a device should also be understood as a corresponding method step or as a feature of a method step. Analogously thereto, aspects described in connection with or as a method step also constitute a description of a corresponding block or detail or feature of a corresponding device. Some or all of the method steps can be performed by a hardware apparatus (or using a hardware apparatus), such as, for example, a microprocessor, a programmable computer or an electronic circuit. In some examples, some or a plurality of the most important method steps can be performed by such an apparatus.

The examples described above merely constitute an illustration of the principles of the present disclosure. It goes without saying that modifications and variations of the arrangements and details described herein will become apparent to other persons skilled in the art. Therefore, it is intended that the disclosure be restricted only by the scope of protection of the appended patent claims, rather than by the specific details presented on the basis of the description and the explanation of the examples herein.

In the detailed description above it can be seen that different features are grouped together in examples. This manner of disclosure should not be understood as an intention that the claimed examples require more features than are explicitly mentioned in the respective claim. Rather, the situation is such that inventive content may reside in fewer than all features of an individual example disclosed. Therefore, the following claims should hereby be deemed to be incorporated in the description, wherein each claim by itself can stand as a separate example. Although each claim by itself can stand as a separate example, it should be noted that—although a dependent claim can refer in the claims to a specific combination with one or a plurality of claims— other examples can also encompass or include a combination of said dependent claim with the subject matter of any other dependent claim or a combination of any feature with other dependent and independent claims. Such combinations are proposed herein, unless it is explicitly expressed that a specific combination is not intended. Furthermore, it is also intended that features of a claim can be included in any other independent claim, even if said claim is not directly dependent on the independent claim.

It should furthermore be noted that methods disclosed in the description or in the claims can be implemented by a device comprising means for performing the respective steps or actions of this method.

Furthermore, in some examples, an individual step/action can be subdivided into a plurality of sub-steps or contain a plurality of sub-steps. Such sub-steps can be contained in the disclosure of the individual step and be part of the disclosure of the individual step.

While the foregoing disclosure shows illustrative examples of the disclosure, it should be noted that various changes and modifications could be made herein without departing from the scope of the disclosure as defined by the appended claims. The functions, steps and/or actions of the method claims in accordance with the examples of the disclosure described herein need not be performed in any particular order. Furthermore, although elements of the disclosure may be described or claimed in the singular, the plural is contemplated unless limitation to the singular is explicitly stated.

What is claimed is:

1. A semiconductor package, comprising:
   a heat spreader having a bottom side and a perimeter;
   an outer perimeter portion attached to the bottom side of the heat spreader along the perimeter of the heat spreader, the outer perimeter portion having a plurality of electrical pathways therein;
   a package substrate located below and spaced from the outer perimeter portion, the package substrate having a plurality of electrical pathways therein;
   a plurality of connection points located between the outer perimeter portion and the package substrate, the plurality of connection points coupling the plurality of electrical pathways of the outer perimeter portion to the plurality of electrical pathways of the package substrate; and
   wherein the outer perimeter portion forms a cavity on the bottom side of the heat spreader.

2. The semiconductor package of claim 1, further comprising a semiconductor die located in the cavity, the semiconductor die being thermally coupled to the heat spreader and electrically coupled to the package substrate and the outer perimeter portion.

3. The semiconductor package of claim 2, wherein the outer perimeter portion provides supplemental signal, power or ground pathways for signals from the package substrate and the semiconductor die.

4. The semiconductor package of claim 3, wherein the heat spreader provides mechanical support for the package substrate and heat dissipation for the semiconductor die.

5. The semiconductor package of claim 4, wherein the heat spreader is composed of metal.

6. The semiconductor package of claim 5, further comprising a thermal interface material located between a bottom of the cavity and the semiconductor die.

7. The semiconductor package of claim 6, wherein the semiconductor package is integrated into one of a mobile phone, a mobile communication device, a pager, a personal digital assistant, a personal information manager, a mobile hand-held computer, a laptop computer, a wireless device, or a wireless modem.

8. A semiconductor package, comprising:
   a heat spreader having a bottom side and a perimeter;
   an outer perimeter portion attached to the bottom side of the heat spreader along the perimeter of the heat spreader, the outer perimeter portion having a plurality of electrical pathways therein;
   an inner portion attached to the bottom side of the heat spreader, the inner portion having a plurality of electrical pathways therein;
   a package substrate located below and spaced from the outer perimeter portion, the package substrate having a plurality of electrical pathways therein;
   a plurality of connection points located between the outer perimeter portion and the package substrate, the plurality of connection points coupling the plurality of electrical pathways of the outer perimeter portion to the plurality of electrical pathways of the package substrate; and
   wherein the outer perimeter portion and the inner portion form a first cavity on the bottom side of the heat spreader and a second cavity on the bottom side of the heat spreader horizontally adjacent the first cavity and spaced therefrom.

9. The semiconductor package of claim 8, further comprising a first semiconductor die located in the first cavity and a second semiconductor die located in the second cavity, the first semiconductor die and the second semiconductor die being thermally coupled to the heat spreader and electrically coupled to the package substrate, the outer perimeter portion, and the inner portion.

10. The semiconductor package of claim 9, wherein the outer perimeter portion provides supplemental signal, power or ground pathways for signals from the package substrate, the first semiconductor die, and the second semiconductor die.

11. The semiconductor package of claim 10, wherein the heat spreader provides mechanical support for the package substrate and heat dissipation for the first semiconductor die and the second semiconductor die.

12. The semiconductor package of claim 11, wherein the heat spreader is composed of metal.

13. The semiconductor package of claim 12, further comprising a first thermal interface material located between a bottom of the first cavity and the first semiconductor die; and a second thermal interface material located between the bottom of the second cavity and the second semiconductor die.

14. The semiconductor package of claim 13, wherein the semiconductor package is integrated into one of a mobile phone, a mobile communication device, a pager, a personal digital assistant, a personal information manager, a mobile hand-held computer, a laptop computer, a wireless device, or a wireless modem.

15. A heat spreader, comprising:
   a first portion having a bottom side and a perimeter;
   an outer perimeter portion attached to the bottom side of the first portion along the perimeter of the first portion, the outer perimeter portion having a plurality of electrical pathways therein;
   a plurality of connection points located on a bottom side of the outer perimeter portion opposite the first portion, the plurality of connection points being coupled to the plurality of electrical pathways of the outer perimeter portion and providing an external connection; and wherein the outer perimeter portion forms a cavity on the bottom side of the first portion.

16. The heat spreader of claim 15, further comprising a semiconductor die located in the cavity, the semiconductor die being thermally coupled to the first portion and electrically coupled to a package substrate and the outer perimeter portion.

17. The heat spreader of claim 16, wherein the outer perimeter portion provides supplemental signal, power or ground pathways for signals from the package substrate and the semiconductor die.

18. The heat spreader of claim 17, wherein the first portion provides mechanical support for the package substrate and heat dissipation for the semiconductor die.

19. The heat spreader of claim 18, wherein the first portion is composed of metal.

20. The heat spreader of claim 19, further comprising a thermal interface material located between a bottom of the cavity and the semiconductor die.

21. The heat spreader of claim 20, wherein the heat spreader is integrated into one of a mobile phone, a mobile communication device, a pager, a personal digital assistant, a personal information manager, a mobile hand-held computer, a laptop computer, a wireless device, or a wireless modem.

22. A heat spreader, comprising:
a first portion having a bottom side and a perimeter;
an outer perimeter portion attached to the bottom side of the first portion along the perimeter of the first portion, the outer perimeter portion having a plurality of electrical pathways therein;
an inner portion attached to the bottom side of the first portion, the inner portion having a plurality of electrical pathways therein;
a plurality of connection points located between the outer perimeter portion and a package substrate, the plurality of connection points coupling the plurality of electrical pathways of the outer perimeter portion to a plurality of electrical pathways in the package substrate; and
wherein the outer perimeter portion and the inner portion form a first cavity on the bottom side of the first portion and a second cavity on the bottom side of the first portion horizontally adjacent the first cavity and spaced therefrom.

23. The heat spreader of claim 22, further comprising a first semiconductor die located in the first cavity and a second semiconductor die located in the second cavity, the first semiconductor die and the second semiconductor die being thermally coupled to the first portion and electrically coupled to the package substrate, the outer perimeter portion, and the inner portion.

24. The heat spreader of claim 23, wherein the outer perimeter portion provides supplemental signal, power or ground pathways for signals from the package substrate, the first semiconductor die, and the second semiconductor die.

25. The heat spreader of claim 24, wherein the first portion provides mechanical support for the package substrate and heat dissipation for the first semiconductor die and the second semiconductor die.

26. The heat spreader of claim 25, wherein the first portion is composed of metal.

27. The heat spreader of claim 26, further comprising a first thermal interface material located between a bottom of the first cavity and the first semiconductor die; and a second thermal interface material located between the bottom of the second cavity and the second semiconductor die.

28. The heat spreader of claim 27, further comprising a package substrate located below and spaced from the outer perimeter portion, the package substrate having a plurality of electrical pathways therein.

29. The heat spreader of claim 28, wherein the outer perimeter portion is composed of a dielectric material.

30. The heat spreader of claim 29, wherein the heat spreader is integrated into one of a mobile phone, a mobile communication device, a pager, a personal digital assistant, a personal information manager, a mobile hand-held computer, a laptop computer, a wireless device, or a wireless modem.

* * * * *